(12) United States Patent
Douezy et al.

(10) Patent No.: US 6,934,674 B1
(45) Date of Patent: Aug. 23, 2005

(54) CLOCK GENERATION AND DISTRIBUTION IN AN EMULATION SYSTEM

(75) Inventors: Francois Douezy, Poissy (FR); Frederic Reblewski, Paris (FR); Jean Barbier, Chatillon (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 09/404,923

(22) Filed: Sep. 24, 1999

(51) Int. Cl.[7] .............................................. G06F 9/455
(52) U.S. Cl. ............................ 703/23; 703/25; 703/27; 703/28; 703/19
(58) Field of Search ............................ 703/28, 19, 27, 703/23

(56) References Cited

U.S. PATENT DOCUMENTS

| | | | |
|---|---|---|---|
| 4,759,014 A | * 7/1988 | Decker et al. | 370/503 |
| 5,036,473 A | 7/1991 | Butts et al. | |
| 5,452,239 A | 9/1995 | Dai et al. | |
| 5,491,442 A | * 2/1996 | Mirov et al. | 327/115 |
| 5,623,418 A | * 4/1997 | Rostoker et al. | 716/1 |
| 5,701,441 A | * 12/1997 | Trimberger | 326/39 |
| 5,838,956 A | * 11/1998 | Kawasaki et al. | 327/291 |
| 5,954,787 A | * 9/1999 | Eun | 708/276 |
| 6,055,489 A | * 4/2000 | Beatty et al. | 327/512 |
| 6,064,247 A | * 5/2000 | Krakirian | 327/115 |
| 6,135,648 A | * 10/2000 | Stefek et al. | 703/13 |
| 6,304,125 B1 | * 10/2001 | Sutherland | 327/141 |
| 6,392,496 B1 | * 5/2002 | Lee et al. | 327/156 |

FOREIGN PATENT DOCUMENTS

| | | |
|---|---|---|
| JP | 50-72549 | 6/1975 |
| JP | 56-68813 | 6/1981 |
| JP | 57-148231 | 9/1982 |
| JP | 57-185720 | 11/1982 |
| JP | 58-014227 | 1/1983 |
| JP | 58-175035 | 10/1983 |
| JP | 59-9765 | 1/1984 |
| JP | 59-085527 | 5/1984 |
| JP | 60-49421 | 3/1985 |
| JP | 61-133830 | 8/1986 |
| JP | 61-267812 | 11/1986 |
| JP | 62-194510 | 8/1987 |
| JP | 63-007016 | 1/1988 |
| JP | 63-44215 | 2/1988 |
| JP | 63-276915 | 11/1988 |
| JP | 64-46118 | 2/1989 |
| JP | 1-260518 | 10/1989 |
| JP | 2-209010 | 8/1990 |
| JP | 03-085012 | 4/1991 |
| JP | 3-248213 | 11/1991 |
| JP | 4-315209 | 11/1992 |
| JP | 06-282348 | 10/1994 |
| JP | 07-262037 | 12/1995 |

OTHER PUBLICATIONS

Rahkonen, T.; Eksyma, H., "A 3–V programmable clock generator with a built–in phase interpolator," Proceedings of the 1998 Midwest Symposium on Circuits and Systems, 1998, pp.: 488–491.*

(Continued)

*Primary Examiner*—W Thomson
(74) *Attorney, Agent, or Firm*—Banner & Witcoff, Ltd.

(57) ABSTRACT

A method and apparatus for clock generation and distribution in an emulation system is described. The present invention provides a method and apparatus for generating a derived clock signal with a circuit having a look up table. A counter circuit counts clock cycles and provides an index into the look up table. A frequency divider circuit may be used between the counter circuit and a base clock signal to provide an intermediate clock signal with a frequency that is less than the frequency of the base clock signal. In one embodiment, a selection circuit is provided to select between the base clock signal and an external clock signal.

9 Claims, 4 Drawing Sheets

OTHER PUBLICATIONS

"Translation of Final Rejection of the Japanese Patent Office," from counterpart Japanese Application No. 2001-500405, mailed Mar. 25, 2003 (2 pages).

"Translation of an Office Action of Japanese Patent Office," from counterpart Japanese Application No. 2001-500405, 3 pgs., mailed Aug. 27, 2002.

XILINX, "The Programmable Gate Array Design Handbook," First Edition, 1986, pp. i-A-10.

Mel Bazes, "An Interpolating Clock Synthesizer," IEEE J. of Solid State Circuits, vol. 31, No. 9, pp. 1295-1301 (Sep. 1996).

International Search Report for PCT/US00/03261, issued Jun. 23, 2000.

Translation of Oct. 28, 2003 Office Action in Japanese application 2001-500405.

* cited by examiner

CLOCK GENERATION AND DISTRIBUTION IN AN EMULATION SYSTEM

FIELD OF THE INVENTION

The present invention relates to emulation systems, and more particularly, the present invention relates to generation and distribution of multiple synchronized clock signals in an emulation system.

BACKGROUND OF THE INVENTION

Prior art clock generation and distribution schemes for emulation systems typically include a base clock signal, circuitry for frequency multiplying or frequency dividing the base clock signal to generate derived clock signals and circuitry for distributing the derived clock signals. The derived clock signals are typically related to the base clock signal by powers of two. For example, the base clock signal may be frequency divided by two and frequency multiplied by two in order to provide three synchronized clock signals having different frequencies. To generate these derived clock signals, dedicated circuitry is provided to generate each derived clock signal. Additional or different clock signals require additional or different circuitry.

Thus, prior art clock generation and distribution schemes are rigid with respect to the number of derived clock signals provided and the relationship of the derived clock signals to the base clock signal. In particular, prior art clock generation and distribution schemes are unworkable for emulation systems that employ many clocks.

When providing multiple clock signals derived from a single base clock signal, the emulation system typically starts, stops and resumes the base clock signal to start, stop and resume emulation. However, derived clock signals may not be in phase with the base clock signal. When the derived clock signals are not in phase with the base clock signal and emulation is stopped, emulation stops with respect to a rising or falling edge of the base clock signal. However, in clock domains operating on derived clock signals emulation continues until a subsequent derived clock edge. When emulation is resumed, the base clock signal resumes where stopped, however, because the derived clock signals may not be stopped at the same point in time as the base clock signals because the derived clock signals may be out of phase with respect to the base clock signal, the derived clock signals may not resume at the point where emulation was stopped. Therefore, these prior art clock distribution schemes may not provide fully functional start, stop and resume functionality for emulation.

Therefore, what is needed is a clock generation and distribution method and apparatus that allows generation of derived clock signals without specific circuitry for each derived clock frequency that allows derived clock signals to resume where stopped whether or not the derived clock signal is in phase with the base clock signal.

SUMMARY OF THE INVENTION

A method and apparatus for generating one or more derived clock signals is disclosed. In one embodiment, several derived clock signals are generated from a look up table. A counter circuit counts base clock cycles and provides an index to the look up table. Emulation can be stopped by stopping the base clock signal, which stops the derived clock signals at a stopping point in the respective derived clock cycles. The derived clock signals do not continue to a subsequent transition before stopping. Emulation is resumed by resuming the base clock signal, which causes the derived clock signals to resume at the stopping point in the respective derived clock signal cycle.

Derived clock signals can be resumed where stopped whether at an edge or not to continue emulation thus providing more precise emulation. Look up tables also increase ease of synchronization between derived clock signals over the prior art because multiple derived clock signals are generated in parallel by similar circuitry that result in approximately the same delay for each derived clock signal and transients or irregularities that occur in the base clock signal are passed to the derived clock signals. Thus, if distribution networks are designed to reduce or eliminate clock skew, the derived clock signals maintain the desired phase relationships.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION

A method and apparatus for clock generation and distribution in an emulation system is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid obscuring the present invention.

Briefly, the present invention provides a method and apparatus for generating one or more derived clock signals with a circuit having a look up table. A counter circuit counts base clock cycles and provides an index into the look up table. In one embodiment, a frequency divider circuit can be used between the counter circuit and a base clock signal to provide an intermediate clock signal with a frequency that is less than the frequency of the base clock signal.

By generating derived clock signals with circuits having look up tables, the derived clock frequencies and duty cycles may be modified by changing the entries in the look up table rather than changing the hardware that provides the derived clock signals as in the prior art thus providing greater flexibility. Additionally, derived clock signals may be resumed where stopped whether at an edge or not to continue emulation thus providing more precise emulation. Look up tables also increase ease of synchronization between derived clock signals over the prior art because multiple derived clock signals are generated in parallel by similar circuitry that result in approximately the same delay for each derived clock signal and transients or irregularities that occur in the base clock signal are passed to the derived clock signal(s).

In one embodiment, a selection circuit is provided to select between the base clock signal and an external clock signal. The external clock signal can be, for example, a derived clock signal from another circuit, an alternative base clock signal, or any other timing signal. The selection circuit can also include a frequency multiplier to multiply the external clock signal.

Overview of Clock Generation Circuitry

Figure 1:
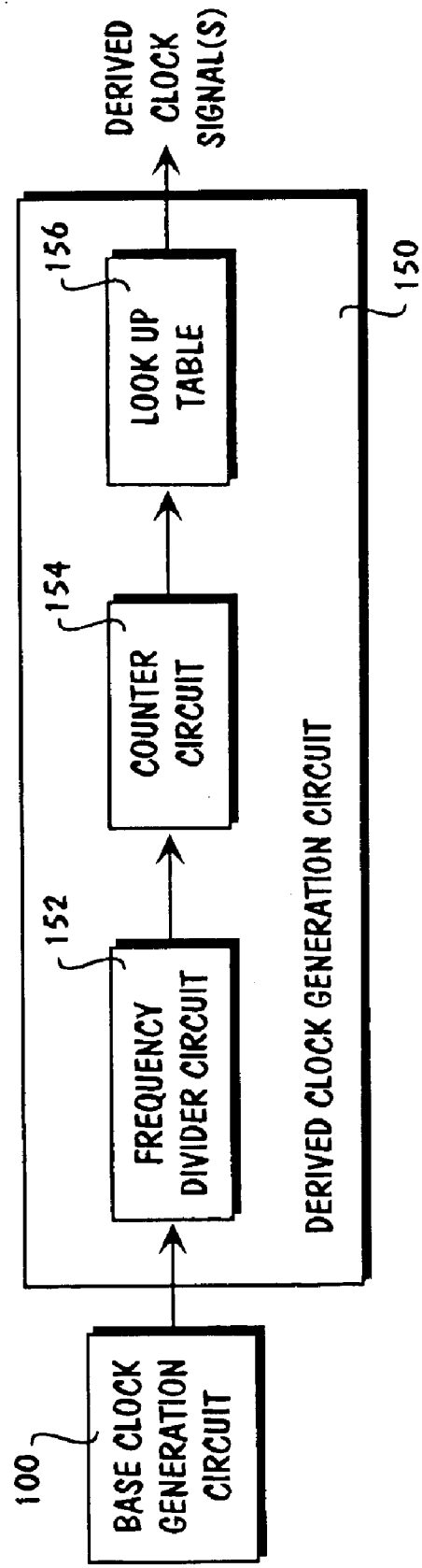
FIG. 1 is one embodiment of timing generation circuitry for generating derived clock signals according to the present invention.

FIG. 1 is one embodiment of clock generation circuitry according to the present invention. Derived clock generation circuit 150 receives a base clock signal from base clock generation circuit 100 to generate a derived clock signal. Base clock generation circuit 100 may be a high frequency oscillator, such as a crystal, or any type of circuit that generates a clock signal with the desired frequency.

Derived clock generation circuit 150 generally comprises frequency divider circuit 152, counter circuit 154, and look up table 156. Frequency divider circuit 152 receives a clock signal from base clock generation circuit 100 or other source and generates a lower frequency signal as an output. Frequency divider circuit 152 may be any frequency divider circuit known in the art, or any other type of circuit that provides a frequency division function on the base clock signal received. Alternatively, frequency divider circuit 152 can be replaced by a frequency multiplier circuit to produce a higher frequency clock signal.

Counter circuit 154 receives the output of frequency divider circuit 152 and counts cycles of the clock signal output by frequency divider circuit 152. For example, counter circuit 154 may be a 3-bit counter that counts from 0 to 7. Of course, counter circuit 154 may be a different counter circuit, such as a 2-bit, 4-bit, etc. counter, or any other type of counter circuit.

Look up table 156 receives the output of counter circuit 154, which is used to index entries stored in look up table 156. In one embodiment, look up table 156 comprises asynchronous memory. Any memory configuration that provides look up table functionality can be used. In an embodiment with a 3-bit counter, look up table 156 has eight entries, each of which store an output signal level. The output of look up table 156 is one or more derived clock signals. In an embodiment, with a 3-bit counter and eight entries, look up table 156 sequentially and cyclically outputs the entries stored therein.

Figure 2:
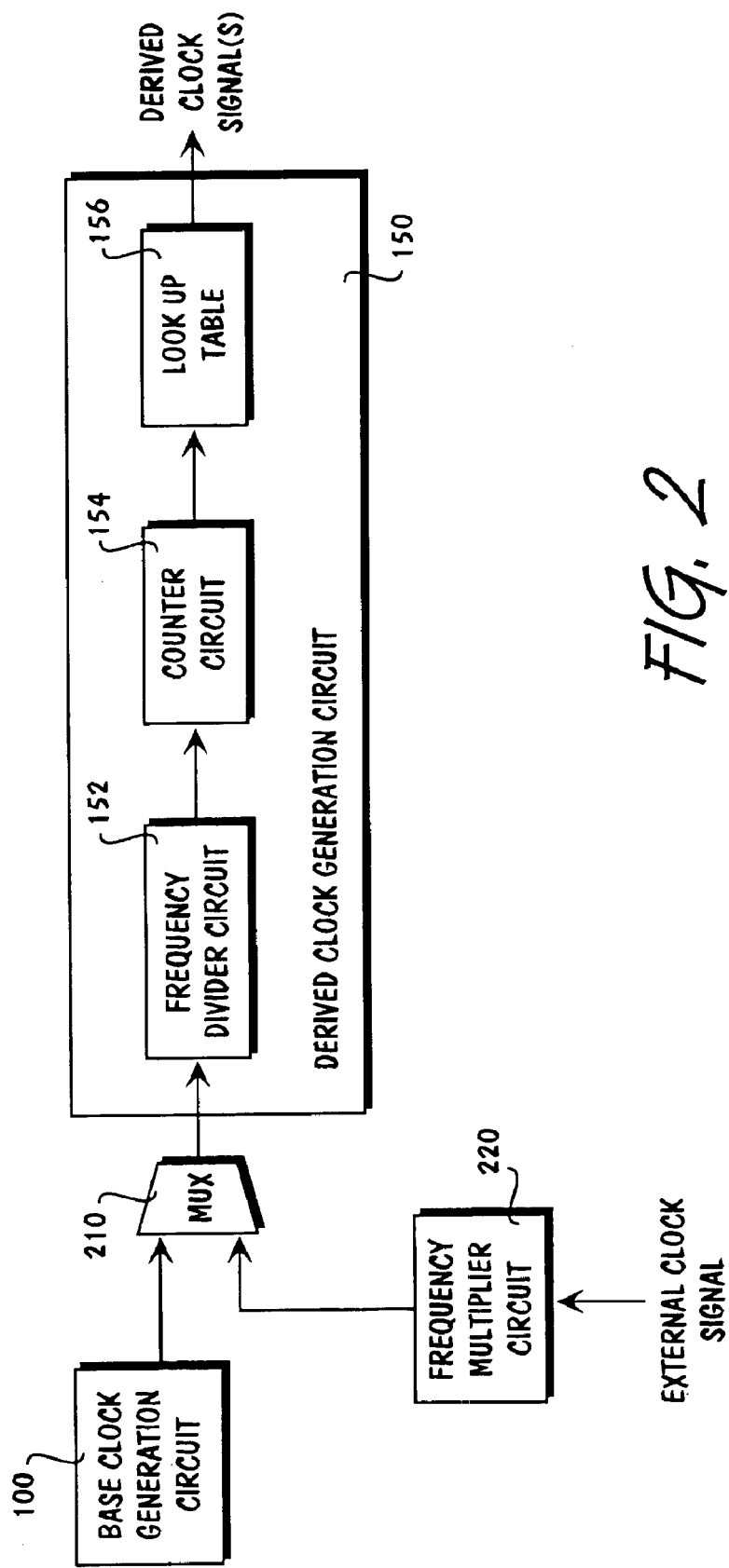
FIG. 2 is one embodiment of timing generation circuitry for generating derived clock signals having a selection circuit according to the present invention.

FIG. 2 is one embodiment of clock generation circuitry including selection circuitry according to the present invention. The circuitry of FIG. 2 is the same as the circuitry of FIG. 1 with the addition of multiplexor 210 and frequency multiplier 220. Multiplexor 210 allows for the selection of external clock signals other than the base clock signal to provide input to derived clock generation circuit 150.

Select signals (not shown in FIG. 2) provided to multiplexor 210 can be generated by a central control circuit that provides select signals to multiple multiplexors. Select signals can also be provided by a derived clock generation circuit that is providing an external clock signal to multiplexor 210. Any manner of generating appropriate control signals known in the art may be used.

By providing the ability to select from multiple clock signals for driving derived clock generation circuit 150, the present invention provides greater flexibility for generating derived clock signals then would otherwise be possible.

In one embodiment, frequency multiplier 220 is coupled between an external clock signal and multiplexor 210. Frequency multiplier 220 multiplies the external clock signal by the appropriate factor to compensate for frequency divider circuit 152 and look up table 156 such that one or more of the derived clock signals has a frequency equal to the external clock signal. By multiplying the external clock signals, the circuitry in derived clock generation circuit 150 may be shared by the external clock signal and the base clock signal. However, transients in the external clock signal are passed through derived clock generation circuit 150 to the output signal. This provides the proper relationship between the external clock signal and the derived clock signals regardless of inconsistencies and/or transients in the external clock signal or the base clock signal, and the ability to start, stop and resume the derived clock signal at points in addition to clock edges.

Figure 3:
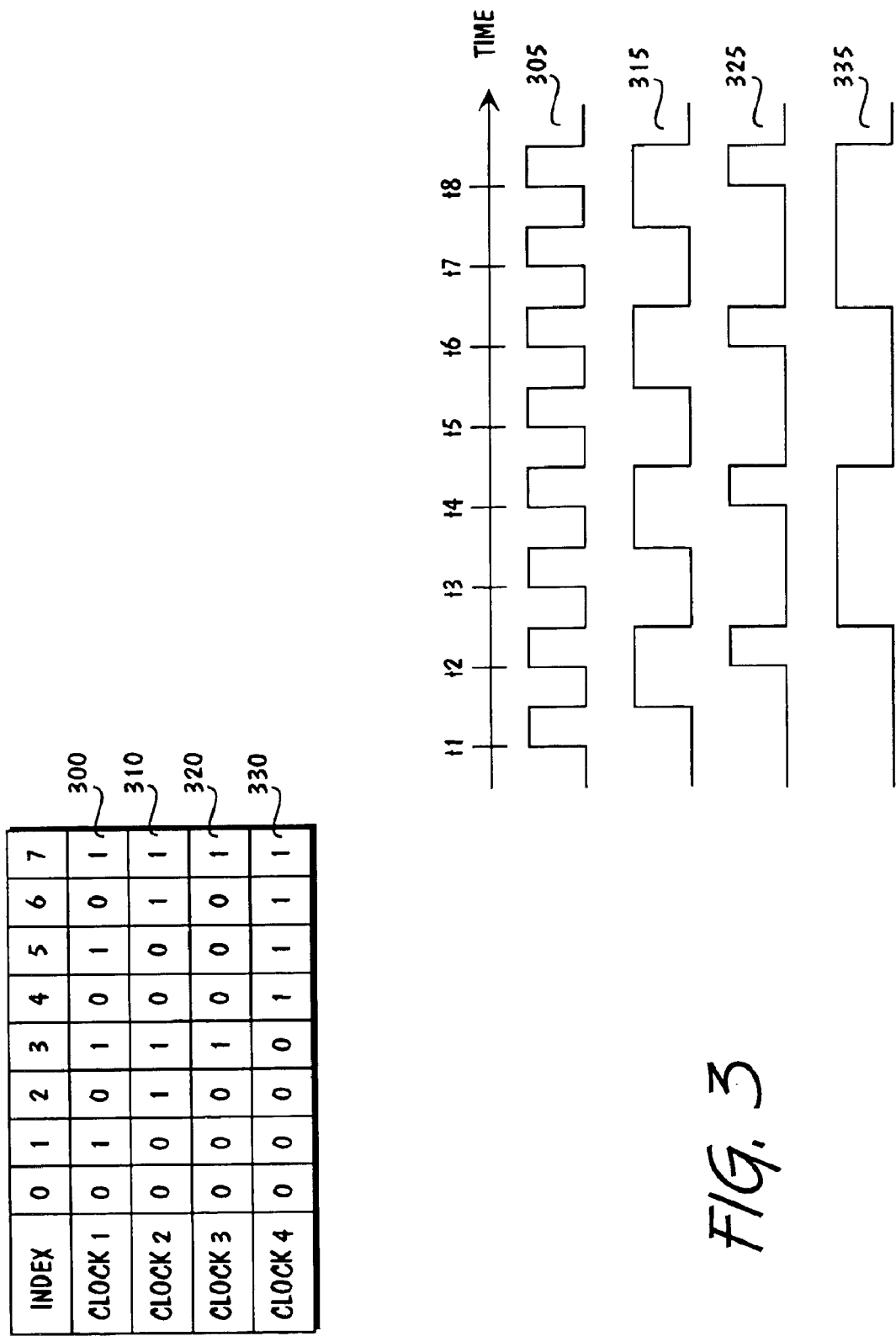
FIG. 3 is one embodiment of look up table entries and corresponding derived clock signals according to the present invention.

FIG. 3 is one embodiment of look up table entries and corresponding derived clock signals according to the present invention. FIG. 3 includes four examples of look up table entries in an eight-entry table and corresponding derived clock signals. It is important to note, however, that any size of look up table may be used and any number of derived clock signal may be generated according to the present invention. In one embodiment, the look up table entries of FIG. 3 are stored in a single look up table; however, multiple look up tables can be used.

Look up table entries 300 correspond to entries in a look up table, such as look up table 156 (shown in FIG. 1). The INDEX entry is the index or address corresponding to a signal level entry. In one embodiment, eight INDEX values labeled 0 through 7 are included in a look up table. Of course, any number of INDEX values may be used. Look up table entries 300 also include CLOCK_1 entries that indicate signal levels for a derived clock signal for each corresponding INDEX value. In one embodiment, a logical 0 corresponds to a low voltage (e.g., 0 V to 0.7 V) and a logical 1 corresponds to a high voltage (e.g., 3 V to 5V). However, alternative entries and voltage levels may also be used.

The INDEX entries correspond to input signals received from counter circuit 154 (shown in FIG. 1). As counter circuit 154 counts from 0 to 7 repeatedly, corresponding signal levels are output. Signal 305 corresponds to look up table entries 300. As the input to the look up table changes, the output from the look up table alternates between a high level and a low level. In this embodiment, the output of the look up table matches the output of the frequency divider circuit in the derived clock generation circuit with the look up table.

Look up table entries 310 generate clock signal 315 with a frequency that is one-half of the frequency of look up table entries 300. An output level (CLOCK_2) is maintained for two consecutive inputs to the look up table.

Look up table entries 320 generate clock signal 325 with the same frequency as clock signal 315 with a different duty cycle. Clock signal 325 is low for three counts from the counter circuit and high for one count. Look up table entries 330 generate clock signal 335 with a frequency that is one-half of the frequency of clock signal 315.

Emulation may be stopped, for example, at time $t_3$, which is a rising edge of CLOCK_1 corresponding to the transition between INDEX values 4 and 5 However, $t_3$ does not correspond to an edge for the other clock signals of FIG. 3. For prior art emulation systems to stop at $t_3$, emulation typically continues until the first edge subsequent to $t_3$. Thus, the clock domains corresponding to CLOCK_2, CLOCK_3, and CLOCK_4 may not stop at $t_3$. For example, CLOCK_2, CLOCK_3, CLOCK_4 stops between $t_3$ and $t_5$. When emulation resumes in the prior art, the stopped clock signals resume from the point at which the clock cycles stopped.

In contrast to the prior art, the present invention allows CLOCK_2, CLOCK_3 and CLOCK_4 to stop and resume at $t_3$ because look up tables are used to generate clock signals. To stop at $t_3$, INDEX values input to look up tables 300, 310, 320 and 330 are sopped at 4. Each clock signal is stopped at that point and does not proceed to the subsequent transition. To resume the clock signals at $t_3$, the INDEX values are incremented to 5 and proceed according to desired emulation sequencing.

Overview of an Emulation System Using Derived Clock Signals

Figure 4:
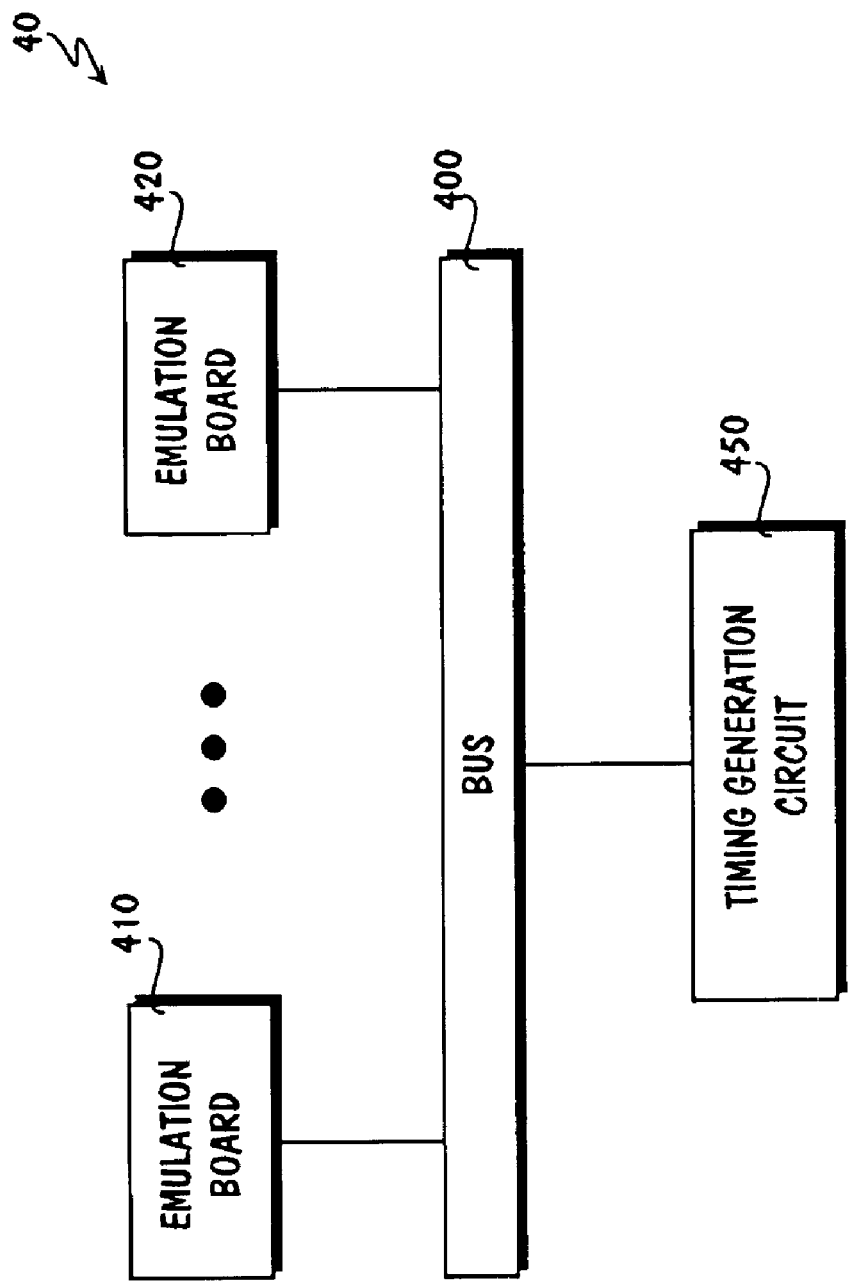
FIG. 4 is one embodiment of an emulation system in which the present invention may be implemented.

FIG. 4 is one embodiment of an emulation system in which the present invention may be implemented. Emulation system 40 generally comprises multiple emulation boards interconnected by a bus or other device. Emulation system 40 also includes a timing generation circuit that provides clock signals to other components of emulation system 40.

Emulation system 40 includes multiple emulation boards, such as emulation boards 410 and 420. Emulation boards allow emulation system 40 to emulate hardware designs for testing and debugging purposes. In one embodiment, each emulation board includes multiple programmable devices (not shown in FIG. 4), such as field programmable gate array (FPGA) devices. Emulation boards are interconnected by bus 400. Alternatively, bus 400 may be replaced by a different device that provides interconnection between multiple boards, such as backplanes and interconnecting boards.

Timing generation circuit 450 is also coupled to bus 400. Timing generation circuit 450 provides one or more clock signals to components of emulation system 40. In one embodiment, timing generation circuit 450 comprises eight circuits for generating derived clock signals. Of course, any number of clock signals may be generated by timing generation circuit 450. In one embodiment, timing generation circuit 450 includes derived clock generation circuitry, such as the circuitry discussed above with respect to FIGS. 2 and 3.

One advantage of generating derived clock signals according to the present invention is that distributed clock signals do not have a phase shift introduced as a result of using multiple clock generation circuits. Thus, if clock distribution paths are designed to reduce or eliminate skew, the derived clock signals remain in phase, which improves emulation as compared to the prior art.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for clock generation and distribution in an emulation system comprising:

generating a derived clock signal from a look up table, wherein an index to the look up table is generated by counting cycles of a base clock signal;

stopping emulation by stopping the base clock signal, wherein the index to the look up table is stopped at a stopping point in a clock cycle of the derived clock signal and the derived clock signal does not continue to a subsequent transition before stopping; and resuming emulation by resuming the base clock signal, wherein the derived clock signal is resumed at the stopping point in the clock cycle of the derived clock signal.

2. The method of claim 1, wherein generating the derived clock signal further comprises:

accessing an entry in a look up table having an address corresponding to a number of clock cycles that have been counted; and outputting a signal level in response to the entry accessed.

3. An emulation system comprising:

a plurality of emulation boards each having hardware to emulate one or more circuit designs;

means for interconnecting the plurality of emulation boards;

a clock generation circuit to stop and resume emulation of the one or more circuit designs comprising
a base clock generation circuit that generates a base clock signal of a first frequency, and
a derived clock generation circuit having
a frequency divider circuit coupled to receive the base clock signal,
a counter circuit coupled to receive an output of the frequency divider circuit, and
a look up table coupled to receive an output of the counter circuit, wherein the output of the counter circuit is used to index entries in the look up table, and further wherein the entries in the look up table indicate a signal level for a derived clock signal generated by the clock generation circuit, wherein when the base clock signal is stopped, the derived clock signal is stopped at a stopping point in a clock cycle of the derived clock signal without continuing to a subsequent transition of the derived clock signal, and the derived clock signal is resumed from the stopping point when the base clock signal is resumed.

4. The emulation system of claim 3, further comprising a plurality of additional clock generation circuits coupled in parallel to generate a plurality of additional derived clock signals.

5. The emulation system of claim 4, wherein the plurality of additional clock generation circuits each further comprise a selection circuit comprising a multiplexor coupled to receive the base clock signal and to receive an external clock signal from an external source, the multiplexor having an output coupled to a respective frequency divider circuit, wherein a select input of the multiplexor is provided by the external source.

6. The emulation system of claim 5, wherein the plurality of additional clock generation circuits each further comprise a frequency multiplier circuit that multiplies the external clock signal and provides a multiplied external clock signal to the multiplexor.

7. The emulation system of claim 3, wherein the derived clock signal is distributed to the plurality of emulation boards.

8. An apparatus for generating clock signals in an emulation system comprising:

means for generating a derived clock signal from a look up table, wherein an index to the look up table is generated by counting cycles of a base clock signal;

means for stopping emulation by stopping the base clock signal wherein the index to the look up table is stopped at a stopping point in a clock cycle of the derived clock signal and the derived clock signal does not continue to a subsequent transition before stopping; and means for resuming emulation by resuming the bass clock signal, wherein the derived clock signal is resumed at the stopping point in the clock cycle of the derived clock signal.

9. The apparatus of claim 8, wherein the means for generating a derived clock signal further comprises:

means for accessing an entry in a look up table having an address corresponding to a number of clock cycles that have been counted; and means for outputting a signal level in response to the entry accessed.

* * * * *